United States Patent
Han et al.

(10) Patent No.: US 8,058,661 B2
(45) Date of Patent: Nov. 15, 2011

(54) SEMICONDUCTOR LIGHT EMITTING DEVICE

(75) Inventors: Sang Hoon Han, Gwangju (KR); Kyung Jun Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 225 days.

(21) Appl. No.: 12/187,729

(22) Filed: Aug. 7, 2008

(65) Prior Publication Data

US 2009/0039362 A1      Feb. 12, 2009

(30) Foreign Application Priority Data

Aug. 9, 2007    (KR) .................. 10-2007-0079892

(51) Int. Cl.
*H01L 33/00*      (2010.01)

(52) U.S. Cl. ................. 257/95; 257/94; 257/16; 257/17

(58) Field of Classification Search ............ 257/94, 257/95
See application file for complete search history.

(56) References Cited

U.S. PATENT DOCUMENTS

| | | | | |
|---|---|---|---|---|
| 5,061,974 A * | 10/1991 | Onodera et al. | ................ | 257/88 |
| 6,541,297 B2 * | 4/2003 | Takahashi | .................... | 438/31 |
| 7,335,573 B2 * | 2/2008 | Takayama et al. | ............ | 438/455 |
| 2004/0072383 A1 * | 4/2004 | Nagahama et al. | ............ | 438/47 |
| 2005/0069012 A1 * | 3/2005 | Shimomura et al. | ............ | 372/87 |
| 2006/0125387 A1 * | 6/2006 | Adachi et al. | ................ | 313/506 |

\* cited by examiner

*Primary Examiner* — Wai Sing Louie
*Assistant Examiner* — Bilkis Jahan
(74) *Attorney, Agent, or Firm* — Birch, Stewart, Kolasch & Birch, LLP (57) ABSTRACT

A semiconductor light emitting device and a method of manufacturing the semiconductor light emitting device are provided. The semiconductor light emitting device comprises a substrate having a top surface that is curved to protrude, and a light emitting structure that is curved to protrude on the substrate and comprises an active layer.

16 Claims, 6 Drawing Sheets

SEMICONDUCTOR LIGHT EMITTING DEVICE

CROSS-REFERENCE TO RELATED APPLICATIONS

The present application claims priority under 35 U.S.C. 119 to Korean Patent Application No. 10-2007-0079892 (filed on Aug. 9, 2007), which is hereby incorporated by reference in its entirety.

BACKGROUND

The present disclosure relates to a semiconductor light emitting device and a method of manufacturing the same.

Group III-V nitride semiconductors have been variously applied to optical devices such as blue and green light emitting diodes (LEDs), high speed switching devices such as a MOSFET (Metal Semiconductor Field Effect Transistor) and an HEMT (Hetero junction Field Effect Transistor), and light sources of lighting devices or display devices.

The nitride semiconductor is mainly used for the LED or an LD (Laser Diode), and studies have been continuously conducted to improve the manufacturing process or a light efficiency of the nitride semiconductor.

SUMMARY

Embodiments provide a semiconductor light emitting device comprising an active layer that are curved to be concave or convex to enlarge a light emitting area thereof, and a method of manufacturing the semiconductor light emitting device.

Embodiments provide a semiconductor light emitting device that can improve internal quantum efficiency of an active layer by forming a light emitting structure on a convex substrate, and a method of manufacturing the same.

Embodiments provide a semiconductor light emitting device that can improve not only internal quantum efficiency but also external quantum efficiency by forming a protrusion/groove pattern on a surface of the curved substrate.

An embodiment provides a semiconductor light emitting device comprising: a substrate comprising a top surface curved to protrude, and a light emitting structure curved to protrude on the substrate and comprises an active layer.

An embodiment provides a semiconductor light emitting device comprising: a first conductive type semiconductor layer curved in a first direction; an active layer curved in the first direction on the first conductive type semiconductor layer; and a second conductive type semiconductor layer curved in the first direction on the active layer.

An embodiment provides a method of manufacturing a semiconductor light emitting device comprising: forming a substrate comprising a top surface curved to protrude; and forming a semiconductor layer comprising a light emitting structure on the top surface of the substrate such that the semiconductor layer is curved to protrude.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In the following description, "on" and "under" of each layer will be referred based on the drawings. Further, the thickness of each layer is exemplarily illustrated and thus the actual thickness of each layer is not limited to the drawings.

Figure 1:
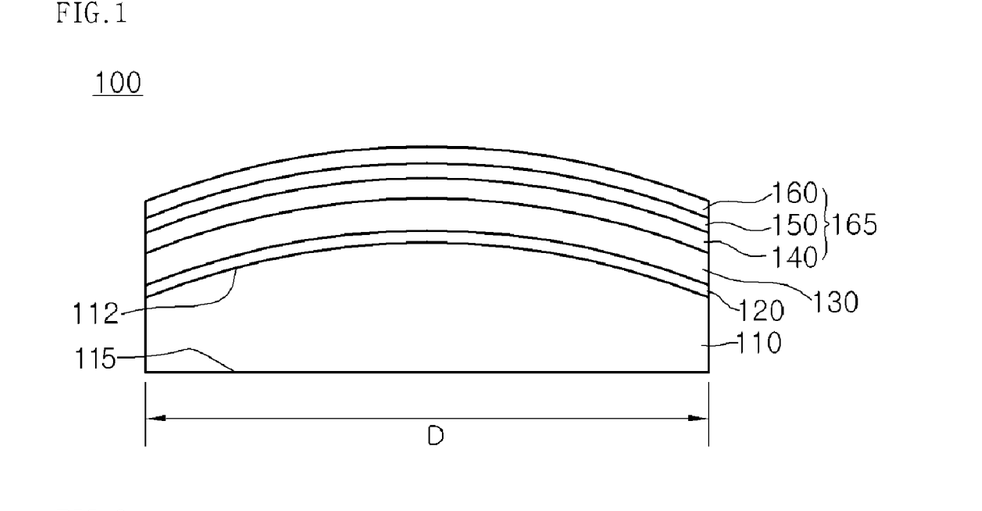
FIG. 1 is a side sectional view of a semiconductor light emitting device according to an embodiment.
Figure 2:
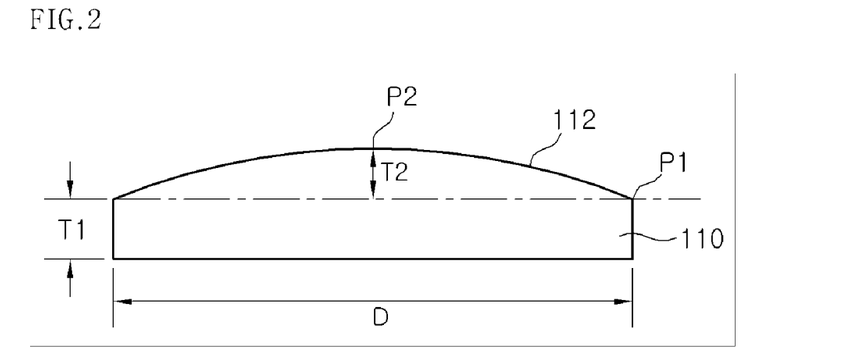
FIG. 2 is a side sectional view of a substrate depicted in FIG. 1.

FIG. 1 is a side sectional view of a semiconductor light emitting device according to an embodiment, and FIG. 2 is a side sectional view of a substrate depicted in FIG. 1.

Referring to FIG. 1, a semiconductor light emitting device 100 comprises a substrate 110 comprising a top surface 112 that is curved to protrude upward, a buffer layer 120, an undoped semiconductor layer 130, a first conductive type semiconductor layer 140, an active layer 150, and a second conductive type semiconductor layer 160.

The substrate 110 may be formed of at least one of sapphire ($Al_2O_3$), SiC, Si, GaAs, GaN, ZnO, Si, GaP, InP, and Ge. The substrate 110 may be a conductive substrate. In the embodiment, a material for the substrate 110 is not specifically limited.

The top surface 112 of the substrate 110 is curved with a predetermined curvature to protrude. That is, the top surface 112 of the substrate 110 is shaped with a predetermined curvature. Here, the shape that is curved with the predetermined curvature may be represented as a bow shape, a convex lens shape, a semi-oval shape, and the like. An undersurface 115 of the substrate 110 may be flat. However, the present disclosure is not limited to this.

In addition, the top surface 112 of the substrate 110 may be formed to protrude with a curvature allowed within a diameter range or a chip size range D.

The top surface 112 of the substrate 110 may be formed through an etching process. Here, the etching process may be a wet etching process or/and a dry etching process. Through the etching process, a flat top surface of the substrate 110 may be processed into the top surface 112 that is curved to protrude. However, the present disclosure is not limited to this etching process.

Referring to FIG. 2, a thickness T1 of the substrate 110 at a lowest point P1 of the top surface 112 is 100-150 μm. A thickness (T1+T2) of the substrate 110 at a highest point P2 is 101~250 μm. Here, the thickness T2 is a height from a horizontal line interconnecting the both lowest points of the top surface 112 to the central highest point P2 of the top surface 112. The thickness T2 is 1-100 μm. That is, the thickness of the substrate 110 at the highest point P2 of the top surface 112 is greater than the thickness of the substrate 110 at the lowest point P1 of the top surface 112 by 1-100 μm.

Referring to FIG. 1, a nitride semiconductor is grown on the substrate 110. At this point, a physical vapor deposition apparatus, a chemical vapor deposition apparatus, a plasma laser deposition apparatus, a dual-type thermal evaporator sputtering apparatus, a metal organic chemical vapor deposition apparatus, and the like are used as a growing apparatus.

The buffer layer 120, and the undoped semiconductor layer 130, and a light emitting structure 165 may be formed on the substrate 110.

The buffer layer 120, the undoped semiconductor layer 130, and the light emitting structure 165 are formed in a shape corresponding to the top surface 112 that is curved with the predetermined curvature.

The buffer layer 120 is for reducing a lattice constant difference from the substrate 110. The buffer layer 120 may be formed of a material selected from the group consisting of GaN, InN, AlN, InGaN, AlGaN, InAlGaN, AlInN, and a combination thereof.

The undoped semiconductor layer 130 may be an undoped GaN layer. The undoped semiconductor layer 130 functions as a substrate on which the nitride semiconductor is grown. At least one of the buffer layer 120 and the undoped semiconductor layer 130 may be omitted.

The light emitting structure 165 may be formed on the undoped semiconductor layer 130. The light emitting structure 165 may comprise a first conductive type semiconductor layer 140, an active layer 150, and a second conductive type semiconductor layer 160.

The first conductive type semiconductor layer 140 is formed on the undoped semiconductor layer 130 and doped with first conductive dopants. The first conductive type semiconductor layer 140 functions as an electrode contacting layer. The first conductive type semiconductor layer 140 may be realized as an N-type semiconductor layer. The N-type semiconductor layer may be formed of a material selected from the group consisting of GaN, InN, AlN, InGaN, AlGaN, InAlGaN, AlInN, and a combination thereof. The first conductive dopants are N-type dopants that are selected from the group consisting of Si, Ge, and Sn, and a combination thereof. Here, a semiconductor layer doped with dopants may be further formed between the undoped semiconductor layer 130 and the first conductive type semiconductor layer 140. However, the present disclosure is not limited to this.

The active layer 150 is formed on the first conductive type semiconductor layer 140. The active layer 150 has a single or multi-quantum well structure. The light emitting material of the active layer 150 may be altered in accordance with a wavelength of light, such as blue, red, green wavelengths.

A conductive cladding layer (not shown) may be formed on or under the active layer 150. The conductive cladding layer may be an AlGaN layer.

The second conductive type semiconductor layer 160 is formed on the active layer 150. The second conductive type semiconductor layer 160 is doped with second conductive dopants to function as an electrode contacting layer. The second conductive type semiconductor layer 160 may be a P-type semiconductor layer that may be formed of a material selected from the group consisting of GaN, InN, AlN, InGaN, AlGaN, InAlGaN, AlInN, and a combination thereof. The second conductive dopants are P-type dopants that may be selected from the group consisting of Mg, Zn, Ca, Sr, Ba, and a combination thereof.

At least one of an N-type semiconductor layer (not shown) and a transparent electrode layer (not shown) that is curved to protrude may be formed on the second conductive type semiconductor layer 160. However, the present disclosure is not limited to this.

The semiconductor layers 120 to 160 are formed in a shape that is curved to protrude by the top surface 112 of the substrate 110. That is, the semiconductor layers 120 to 160 is correspondingly curved with a same curvature as the top surface 112 of the substrate 110.

Since the active layer 150 is curved to protrude, the light emitting area increases and the internal quantum efficiency is improved. Therefore, light emitting efficiency of the light emitting device 100 can be improved.

In addition, the light emitting structure 165 may be one of a P-N junction structure, an N-P junction structure, a P-N-P junction structure, and an N-P-N junction structure.

Figure 3:
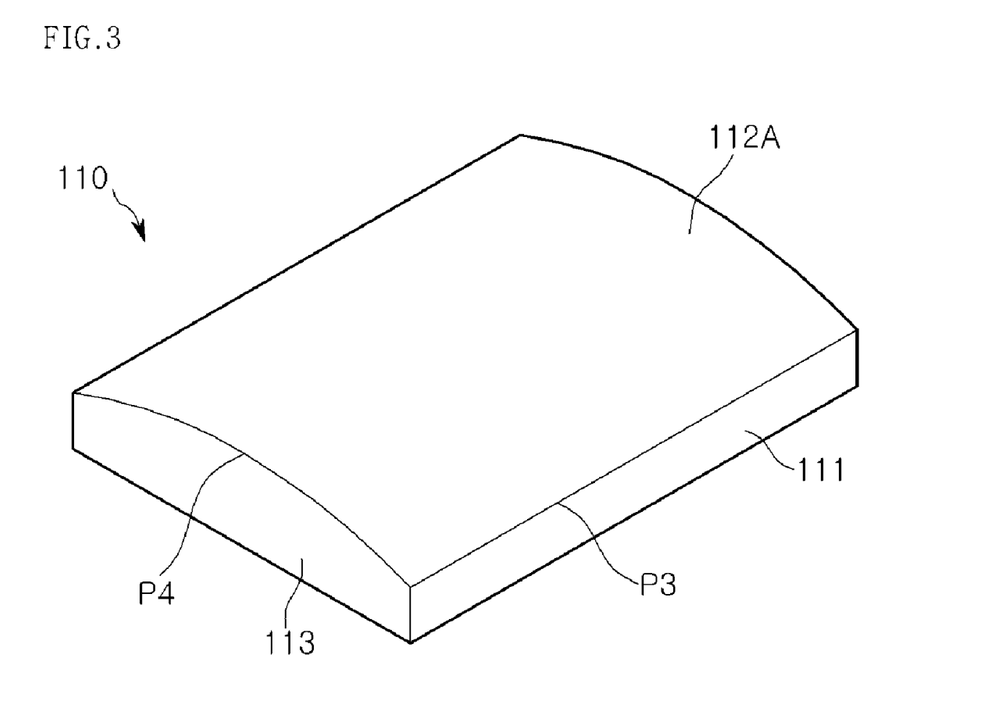
FIG. 3 is a perspective view of a substrate according to a first embodiment.

FIG. 3 is a perspective view of a substrate according to a first embodiment.

Referring to FIG. 3, a top surface 112A of the substrate protrudes with a gentle curve from the left and light lowest points toward the central highest point P4. The lowest portions P3 are upper ends of the left and right sides 111 and the highest point P4 is a center between front and rear sides 113.

Figure 4:
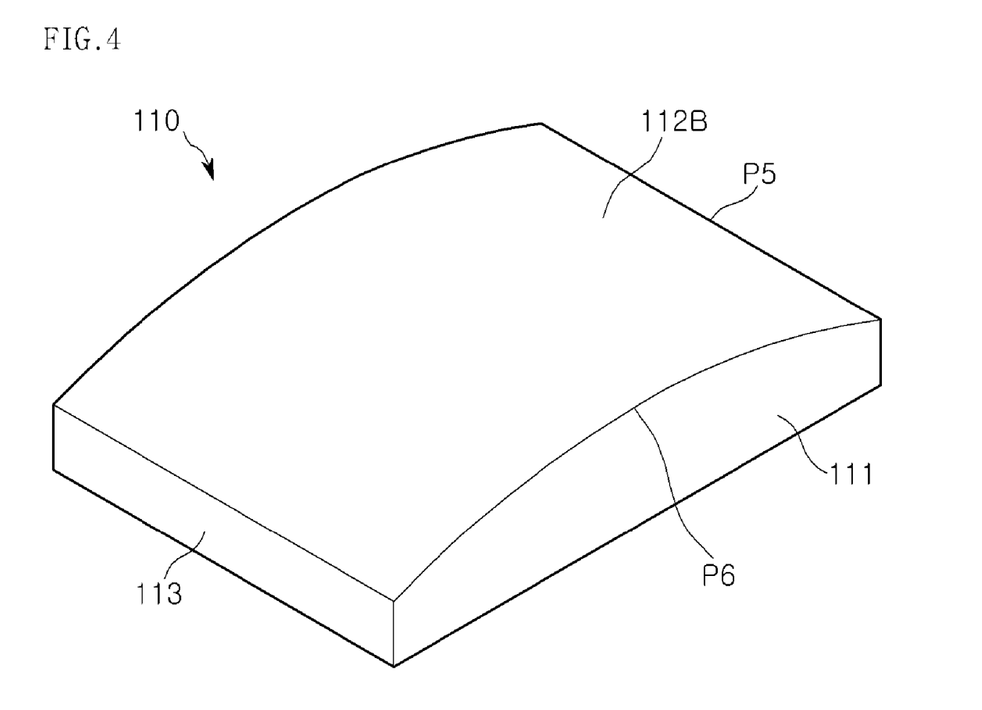
FIG. 4 is a perspective view of a substrate according to a second embodiment.

FIG. 4 is a perspective view of a substrate according to a second embodiment.

Referring to FIG. 4, a top surface 112B of the substrate 110 protrudes with a gentle curve from front and rear lowest points toward a central highest point P6. The lowest points P5 are upper ends of the front and rear sides 113 and the highest point P6 is center between the left and right sides 111.

Figure 5:
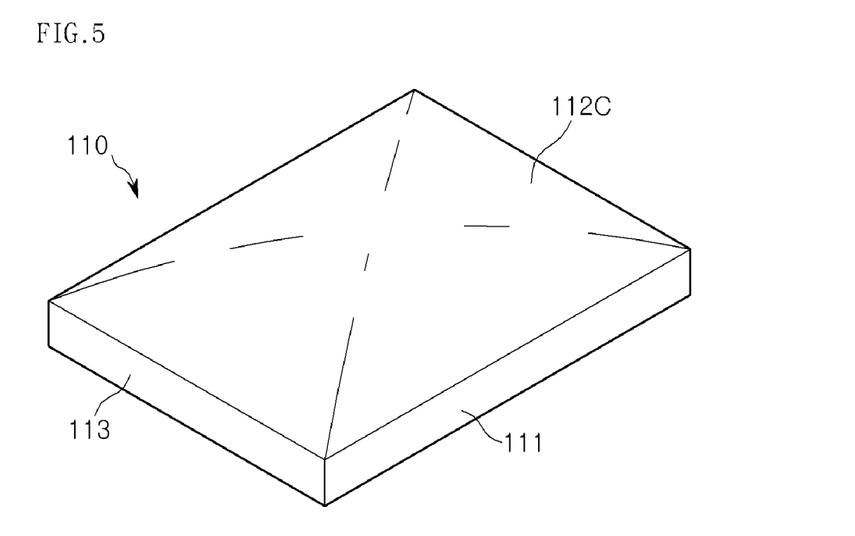
FIG. 5 is a perspective view of a substrate according to a third embodiment.

FIG. 5 is a perspective view of a substrate according to a third embodiment.

Referring to FIG. 5, a top surface 112C of the substrate 110 protrudes with a gentle curve from opposite sides 111 and 113 to a center of the top surface 112C. That is, the top surface 112C protrudes with a gentle curve from the central highest point to the left and right sides 113 and the front and rear sides 111.

As shown in FIGS. 3 to 5, a curving direction or curvature of the top surfaces 112A, 112B, and 112C of the substrate 110 may be varied.

Figure 6:
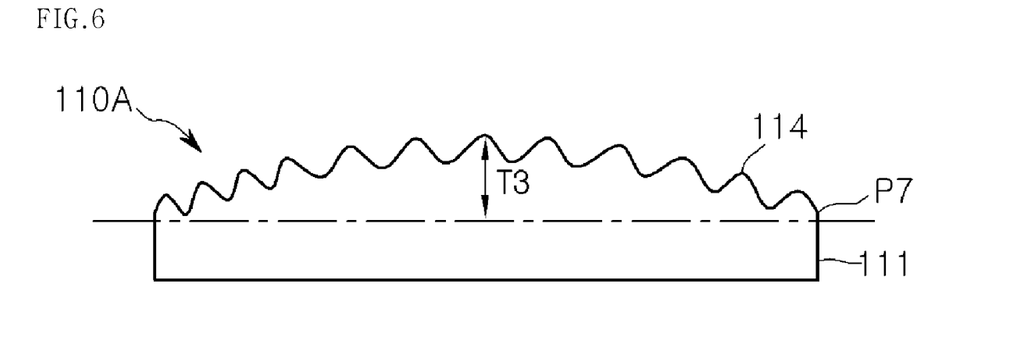
FIG. 6 is a side sectional view of a substrate according to a fourth embodiment.
Figure 7:
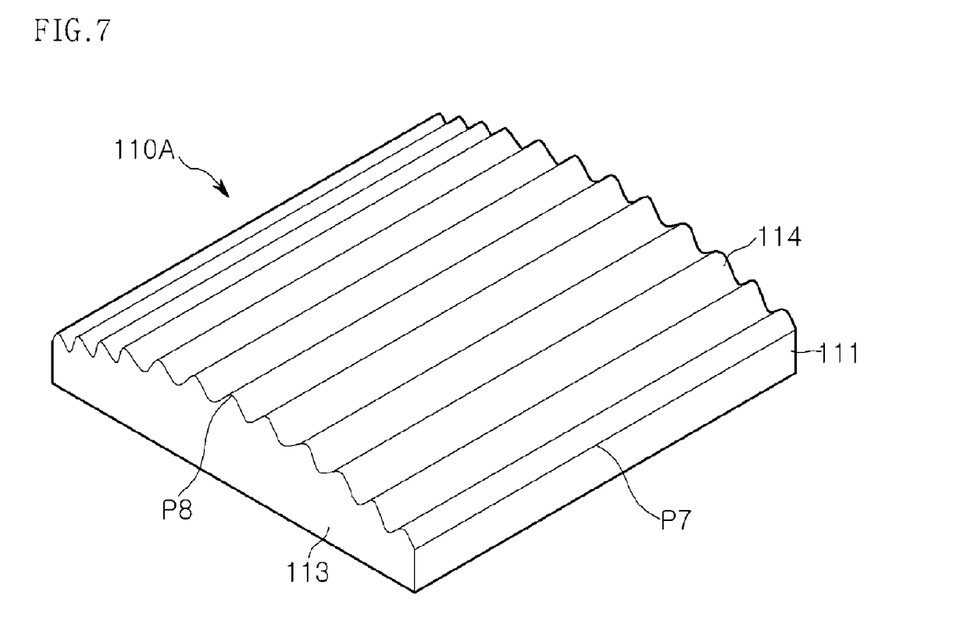
FIG. 7 is a perspective view of FIG. 6.

FIG. 6 is a side sectional view of a substrate according to a fourth embodiment and FIG. 7 is a perspective view of FIG. 6.

Referring to FIGS. 6 and 7, a top surface 114 of a substrate 110A is curved to protrude and provided with a protrusion/groove pattern. The protrusions/groove pattern is formed in a stripe pattern.

A height from a horizontal line connecting both lowest points P7 to a highest point P8 may be a thickness T3 of 1-100 μm.

Since the top surface 114 of the substrate 110A is curved to protrude and provided with the protrusion/groove pattern, the external quantum efficiency increases. In addition, the semiconductor layers formed on the substrate 110A may be formed to correspond to the protrusions/groove pattern and thus a light emitting area of the active layer increases.

Figure 8:
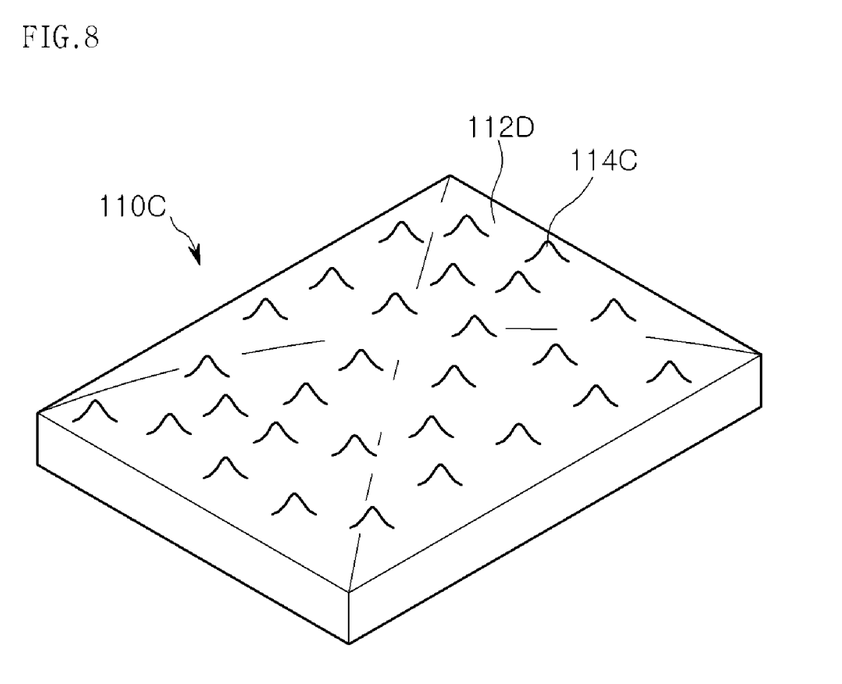
FIG. 8 is a perspective view of a substrate according to a fifth embodiment.

FIG. 8 is a perspective view of a substrate according to a fifth embodiment.

Referring to FIG. 8, a top surface 112D of the substrate 110C is curved to protrude and a protrusion pattern 114C is formed on a curved top surface. The protrusions pattern 114C may comprise at least of a plurality of cone-shaped protrusions, a plurality of hemi-circular-shape protrusions, a plurality of convex lens-shaped protrusions, or a plurality of polygonal-shaped protrusions.

By the curved top surface 112D and the protrusion pattern 114C of the substrate 110C, the external quantum efficiency can be improved. In addition, semiconductor layers on the substrate 110C may be formed to correspond to the protrusion pattern 114C and thus the light emitting area of the active layer increases.

Figure 9:
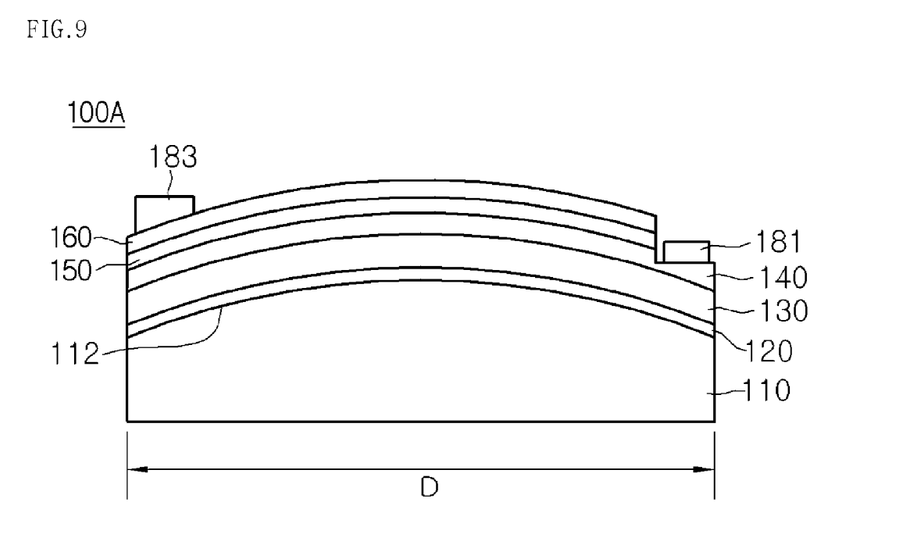
FIG. 9 is a side sectional view of a horizontal semiconductor light emitting device using FIG. 1.

FIG. 9 is a side sectional view of a lateral semiconductor light emitting device using FIG. 1.

Referring to FIG. 9, in a lateral semiconductor light emitting device 100A, a first electrode layer 181 is formed on a first conductive type semiconductor layer 140 and a second electrode layer 183 is formed on the second conductive type semiconductor layer 160. The first conductive type semiconductor layer 140, active layer 150, and second conductive type semiconductor layer 160 are formed to protrude upward. The first electrode layer 181 and second electrode layer 183 are applied with a forward current, the internal quantum efficiency can be improved by the active layer 150 that is curved to protrude upward with a predetermine curvature.

Figure 10:
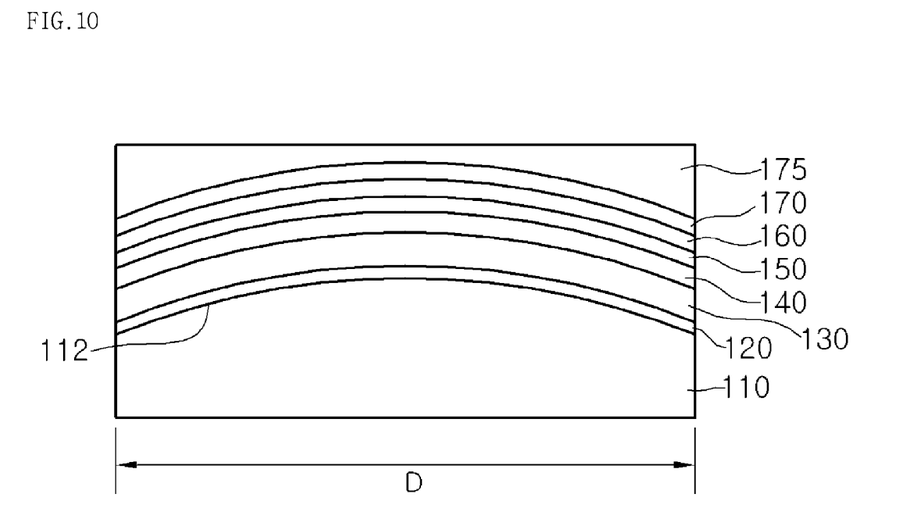
FIGS. 10 and 11 are views illustrating a method of manufacturing a vertical semiconductor light emitting device using FIG. 1.
Figure 11:
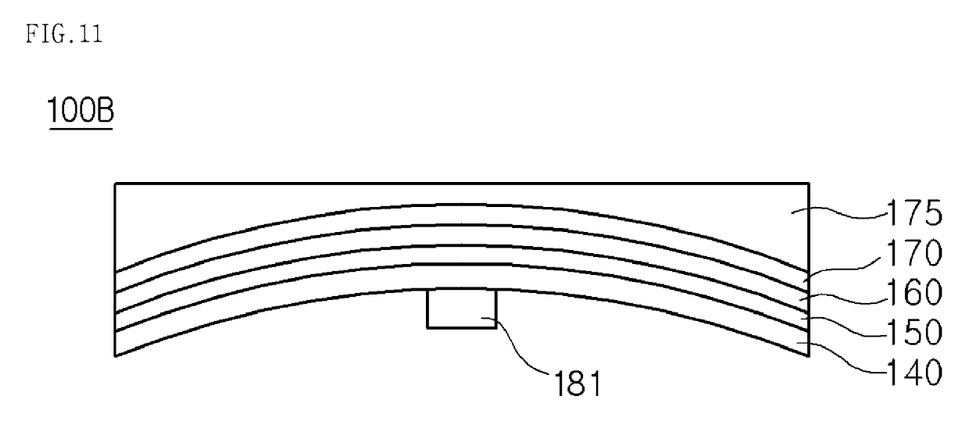

FIGS. 10 and 11 are views illustrating a method of manufacturing a vertical semiconductor light emitting device using FIG. 1.

Referring to FIG. 10, the reflective electrode layer 170 that is curved to protrude is formed on the conductive type semiconductor layer 160 and a conductive supporting substrate 175 is formed on the reflective electrode layer 170. The reflective electrode layer 170 is formed of a material selected from the group consisting of Al, Ag, Pd, Rh, and Pt. The conductive supporting substrate 175 may be formed of copper or gold. However, the present disclosure is not limited to this.

Here, the substrate 110, buffer layer 120, and undoped semiconductor layer 130 may be removed through a physical or/and chemical removing process. Here, a laser lift off (LLO) process that can remove the substrate 110 by irradiating laser having a predetermined wavelength to the substrate 110 may be used as the physical process. The buffer layer 120 may be removed through a wet or dry etching process. In the chemical process, wet etchant is injected to the buffer layer 120 or/and the undoped semiconductor layer 130 between the substrate 110 and the first conductive type semiconductor layer 140 to remove the buffer layer or/and the undoped semiconductor layer 130 and thus the substrate 110 is removed. The buffer layer 120 and undoped semiconductor layer 130 may be removed through a chemical etching process.

Referring to FIG. 11, the first electrode layer 181 may be formed under the first conductive type semiconductor layer 140. Therefore, the vertical semiconductor light emitting device 100B is completed. In the vertical semiconductor light emitting device 100B, since the first conductive type semiconductor layer 140, active layer 150, and second conductive type semiconductor layer are curved to protrude with a predetermined curvature, the internal and external quantum efficiency can be improved.

In addition, when the vertical semiconductor light emitting device 100B is structured such that the conductive supporting substrate 175 is located on a base and the first electrode layer 181 is disposed at an upper portion, the first conductive type semiconductor layer 140, the active layer 150, and the second conductive type semiconductor layer 160 are formed to protrude downward or concaved with a predetermined curvature.

According to the embodiments, by increasing the light emitting area of the active layer, the internal quantum efficiency can be improved. In addition, by forming the semiconductor layer such that it is curved to protrude upward or downward, the light efficiency can be improved.

In the description, it is understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, and one or more intervening layers may also be present. In addition, "on" and "under" of each layer will be referred based on the drawings. Further, the thickness of each layer is exemplarily illustrated and thus the actual thickness of each layer is not limited to the drawings.

Any reference in this specification to "one embodiment," "an embodiment," "exemplary embodiment," etc., means that a particular feature, structure, or characteristic described in connection with the embodiment is comprised in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light emitting device comprising:
a substrate comprising a top surface having a curvature in a first direction and a bottom surface being flat, wherein the substrate has a peak point on the top surface and gradually becomes lower towards an edge of the top surface;
an un-doped layer curved in the first direction on the substrate;
a first conductive type semiconductor layer curved in the first direction on the un-doped layer;
an active layer curved in the first direction on the first conductive type semiconductor layer; and
a second conductive type semiconductor layer curved in the first direction on the active layer,
wherein each of the top surface of the substrate, the un-doped layer, the first conductive type semiconductor layer, the active layer and the second type semiconductor layer is curved towards the same direction.

2. The semiconductor light emitting device according to claim 1, wherein the first conductive type semiconductor layer, the active layer, and the second conductive type semiconductor layer are curved to protrude upward.

3. The semiconductor light emitting device according to claim 1, wherein the first conductive type semiconductor layer, the active layer, and the second conductive type semiconductor layer are curved to protrude downward.

4. The semiconductor light emitting device according to claim 1, wherein the first conductive type semiconductor layer, the active layer, and the second conductive type semiconductor layer are curved with a same curvature.

5. The semiconductor light emitting device according to claim 1, wherein at least one of the layers that are curved is provided with a protrusion/groove pattern.

6. The semiconductor light emitting device according to claim 1, further comprising at least one of a semiconductor layer having the same conductive type as the first conductive type semiconductor layer, a transparent electrode layer, a reflective electrode layer, and a conductive substrate that are formed on the second conductive type semiconductor layer and curved to protrude in the first direction.

7. The semiconductor light emitting device according to claim 1, wherein the substrate comprises at least one of sapphire ($Al_2O_3$), SiC, Si, GaAs, GaN, ZnO, Si, GaP, InP, and Ge, and a highest point of the substrate is higher than a lowest point by 1-100 μm.

8. The semiconductor light emitting device according to claim 1, wherein each of the first conductive type semiconductor layer, the active layer and the second conductive type semiconductor layer has substantially equal thickness in an entire area.

9. The semiconductor light emitting device according to claim 1, wherein the first direction includes only one protrusion.

10. The semiconductor light emitting device according to claim 1, further comprising at least one of a buffer layer and undoped semiconductor layer between the first conductive type semiconductor layer and the substrate.

11. The semiconductor light emitting device according to claim 1, wherein the first conductive type semiconductor layer, the active layer and the second conductive type semiconductor layer are curved with a same curvature as the substrate.

12. The semiconductor light emitting device according to claim 1, wherein the top surface of the substrate protrudes with a predetermined curvature from both opposite lowest points to a central highest point.

13. The semiconductor light emitting device according to claim 1, wherein the lowest points of the top surface of the substrate are formed on at least two sides.

14. The semiconductor light emitting device according to claim 1, wherein a thickness of the substrate at a highest point of the top surface is greater than a thickness of the substrate at a lowest point of the top surface by 1-100 μm.

15. The semiconductor light emitting device according to claim 1, wherein the top surface of the substrate is curved with a protrusion/groove pattern.

16. The semiconductor light emitting device according to claim 15, wherein the protrusion/groove pattern comprises at least one of a plurality of cone-shaped protrusions, a plurality of hemi-circular-shape protrusions, a plurality of convex lens-shaped protrusions, and a plurality of polygonal-shaped protrusions.

* * * * *